(12) United States Patent
Crosby et al.

(10) Patent No.: US 8,214,170 B2
(45) Date of Patent: Jul. 3, 2012

(54) TEST PATTERN COMPRESSION

(75) Inventors: Patrick R. Crosby, Austin, TX (US); Daniel W. Cervantes, Round Rock, TX (US); Johnny J. LeBlanc, Austin, TX (US); Samuel I. Ward, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 630 days.

(21) Appl. No.: 12/354,063

(22) Filed: Jan. 15, 2009

(65) Prior Publication Data

US 2010/0179784 A1    Jul. 15, 2010

(51) Int. Cl.
*G01R 31/14* (2006.01)
(52) U.S. Cl. .................. 702/117; 702/179; 702/196
(58) Field of Classification Search .......... 702/117, 702/179, 196; 704/7; 707/999.101; 714/715, 714/720, 738
See application file for complete search history.

(56) References Cited

U.S. PATENT DOCUMENTS

| | | | |
|---|---|---|---|
| 4,503,536 A | 3/1985 | Panzer | |
| 5,727,000 A | 3/1998 | Pizzica | |
| 5,912,901 A | 6/1999 | Adams et al. | |
| 6,327,687 B1 | 12/2001 | Rajski et al. | |
| 6,543,020 B2 | 4/2003 | Rajski et al. | |
| 6,557,129 B1 | 4/2003 | Rajski et al. | |
| 6,678,739 B1 | 1/2004 | Muraoka | |
| 6,751,767 B1 | 6/2004 | Toumiya | |
| 6,950,974 B1 | 9/2005 | Wohl et al. | |
| 7,111,209 B2 | 9/2006 | Rajski et al. | |
| 7,225,376 B2 | 5/2007 | Appinger et al. | |
| 7,284,176 B2 | 10/2007 | Wang et al. | |
| 7,302,624 B2 | 11/2007 | Rajski et al. | |
| 7,302,626 B2 | 11/2007 | Balakrishnan et al. | |
| 7,386,777 B2 * | 6/2008 | Volkerink et al. | 714/738 |
| 7,797,603 B2 * | 9/2010 | Rajski et al. | 714/738 |
| 2006/0200719 A1 | 9/2006 | Keller | |
| 2007/0050693 A1 | 3/2007 | Kiryu | |

OTHER PUBLICATIONS

Bayraktaroglu. I., et al., "Concurrent Application of Compaction and Compression for Test Time and Data Volume Reduction in Scan Designs", IEEE 2003, Transactions on Computers, V. 52 #11, Nov. 2003.

* cited by examiner

*Primary Examiner* — Michael Nghiem
*Assistant Examiner* — Elias Desta
(74) *Attorney, Agent, or Firm* — Patrick E. Caldwell, Esq.; The Caldwell Firm, LLC

(57) ABSTRACT

A method for test pattern compression generates a first test pattern comprising a plurality of bits. The method identifies bits comprising a don't-care bit value in the first test pattern and replaces the identified bit values with random bit values, to generate a second test pattern. The method determines a fault coverage level of the second test pattern. In the event the determined fault coverage level of the second test pattern exceeds a predetermined individual test pattern fault coverage level, for at least one bit position in the second test pattern corresponding to a replaced identified bit value and detecting at least one fault, the method exchanges the don't care value in the bit position in the first test pattern with the bit value in the corresponding bit position in the second test pattern. The method merges subsequent test patterns that increase fault coverage with the second test pattern.

18 Claims, 6 Drawing Sheets

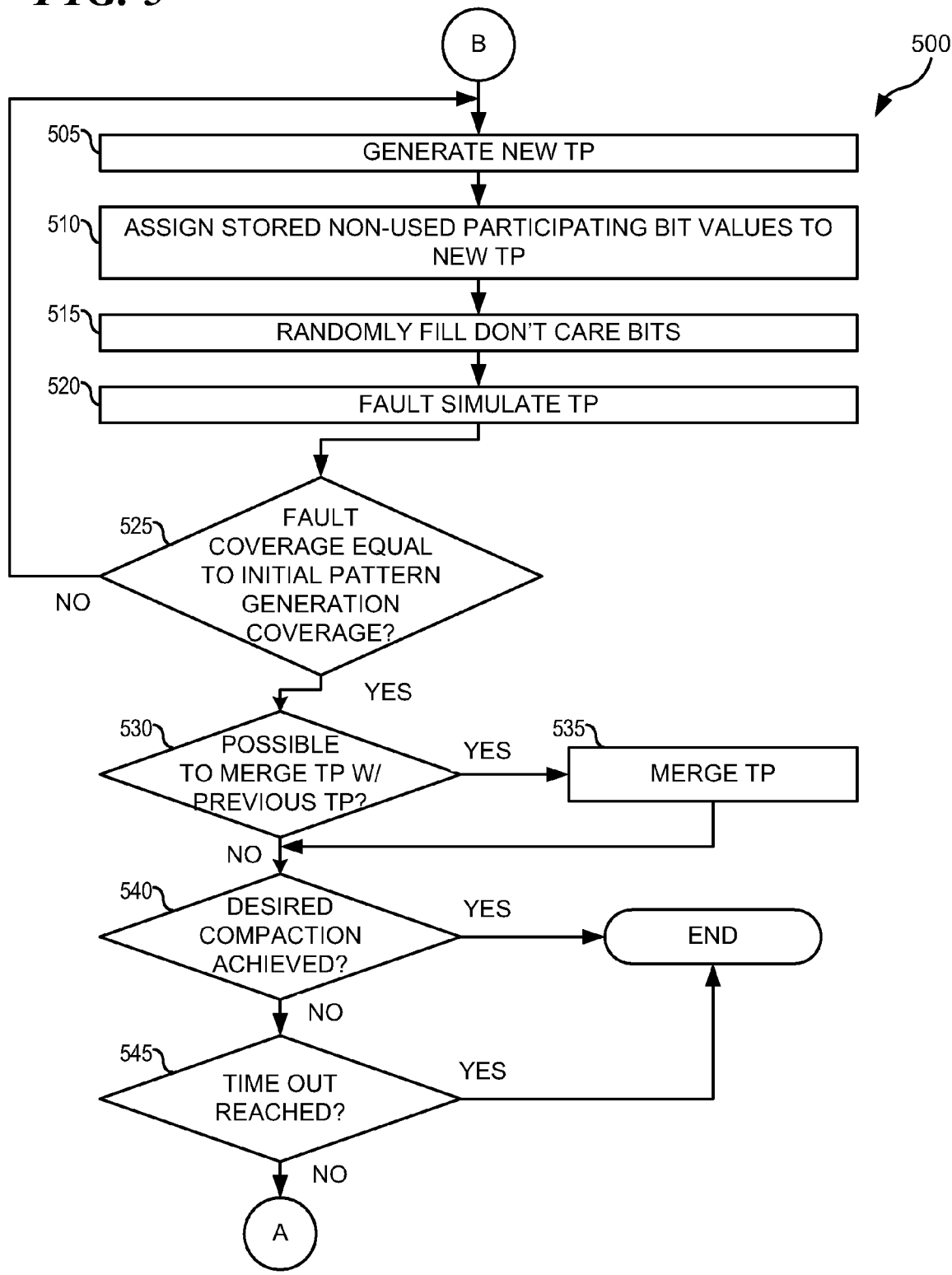

TEST PATTERN COMPRESSION

CROSS-REFERENCE TO RELATED APPLICATIONS

This application relates to co-pending U.S. patent application entitled IMPROVED SCAN CHAIN FAIL DIAGNOSTICS Ser. No. 12/351,950, filed concurrently herewith.

TECHNICAL FIELD

The present invention relates generally to the field of test pattern generation for a device under test and, more particularly, to a system and method for improved test pattern compression.

BACKGROUND OF THE INVENTION

Modern integrated circuit testing methods typically rely on a testing methodology utilizing scan chains. Scan chains allow an increased ability to observe and control the device under test (DUT). Typically, testing methods utilizing scan chains operate in two modes. The first scan chain operation mode is the normal mode, in which the memory elements, or latches, of the integrated circuit perform their normal function. Generally, each latch occupies a position feeding an input into a logic operation. During the normal mode, the latch stores a logic value that is a product of the preceding logic operation, which feeds into the subsequent logic operation.

The second scan chain operation mode is the test mode. During the test mode, the latches of the integrated circuit connect into one or more long shift registers (the "scan chains"). The testing operation shifts test patterns into the scan chains. Generally, test patterns are a series of logic values arranged in the order of the scan chain latch they are to occupy. The circuit performs the logic operations based on the stored values shifted into the latches, typically for a single clock cycle. The latches subsequent to the logic operators store the logic value produced by the logic operations based on the values inputted through the scan chain.

The testing process shifts test responses out of the scan chains, as a test response pattern. The testing process compares the test response pattern to the fault-free test response pattern to determine whether the circuit under test is functioning correctly. The pattern of logic values produced by a normal operation of the circuit under test constitutes the fault-free test response pattern.

Scan design methodology facilitates simple automatic test pattern generation (ATPG) methods. Modern ATPG tools are able to generate deterministic tests. Generally, a deterministic test is a test that achieves almost complete fault coverage for a variety of types of fault models. However, for large circuits, using an approach based on ATPG alone is infeasible. Test approaches using only ATPG typically require a large test set size and a relatively long test time in order to achieve acceptable fault coverage. This large test set size requires excessive storage requirements. Built-in-self-testing (BIST) overcomes, to some extent, the excessive storage requirements for patterns created using ATPG.

BIST uses on-chip pseudo-random pattern generators to supply patterns to the scan chains. During testing, an operator serially feeds test responses into on-chip multiple input shift registers (MISR). The MISRs generate and store the resulting signatures from the test responses. Using the conventional test methodology, a system employing BIST compares the resulting test signatures to previously generated fault-free signatures for the DUT.

Although BIST can cover a significant portion of "stuck-at" faults (a fault model that sticks the output of a logic gate at a either a high logic value or a low logic value independent of the inputs to the logic gate), a typical testing operation also performs additional deterministic tests in order to target random-pattern-resistant (RPR) faults. Thus, an effective test methodology for large designs requires a hybrid testing scheme. This testing scheme includes ATPG for RPR faults not detected by BIST, and BIST to find a total set of deterministic test patterns that bring the fault coverage to the desired level.

While a hybrid-testing scheme does not consume the same amount of storage as a testing scheme relying on ATPG alone, the hybrid-testing scheme still consumes an excessive level of storage. To remedy this, compression methods sometimes accompany ATPG. Generally, compression methods reduce the size of a pattern set without lowering the fault detection rate of the patterns. Compression methods accomplish this result by reducing the amount of data that needs to be stored in the tester memory. Compression also reduces the test time for a given test data bandwidth.

But current compression schemes, especially pattern-merging schemes, suffer from significant drawbacks. As the density of modern circuits continues to grow, modern pattern-merging methods are unable to reduce to a manageable level the set of test patterns necessary to achieve the desired fault coverage. Consequently, modern pattern-merging methods require an increasing amount of storage space as circuit density increases.

The increased size of the set of test patterns necessary to achieve the desired fault coverage also dramatically increases the time needed to perform a test of a dense modern circuit. The testing unit must apply each individual test pattern to the circuit and each application of a test pattern requires a discrete amount of time. Therefore, as the total number of merged test patterns necessary to achieve the desired fault coverage for a dense circuit increases, the test requires an increasing amount of time to perform. The increased time required by the test operation negates one of the original advantages of compression and test pattern merging.

Therefore, there is a need for a method or system for improved test pattern compression that addresses at least some of the problems and disadvantages associated with conventional methods and systems.

BRIEF SUMMARY

The following summary intends to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method for test pattern compression generates a first test pattern comprising a plurality of bits. The method identifies bits comprising a don't-care bit value in the first test pattern and replaces the identified bit values with random bit values, to generate a second test pattern. The method determines a fault coverage level of the second test pattern. In the event the determined fault coverage level of the second test pattern exceeds a predetermined individual test pattern fault coverage level, for at least one bit position in the second test pattern corresponding to a replaced identified bit value and detecting at least one fault, the method exchanges the don't care value in the bit position in the first test pattern with the bit value in the corresponding bit position in the second test pattern. The method merges subsequent test patterns that increase fault coverage with the second test pattern.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

FIG. 5 illustrates a high-level flow diagram depicting logical operational steps of an improved test pattern compression method, which can be implemented in accordance with a preferred embodiment.

DETAILED DESCRIPTION

Figure 1A:
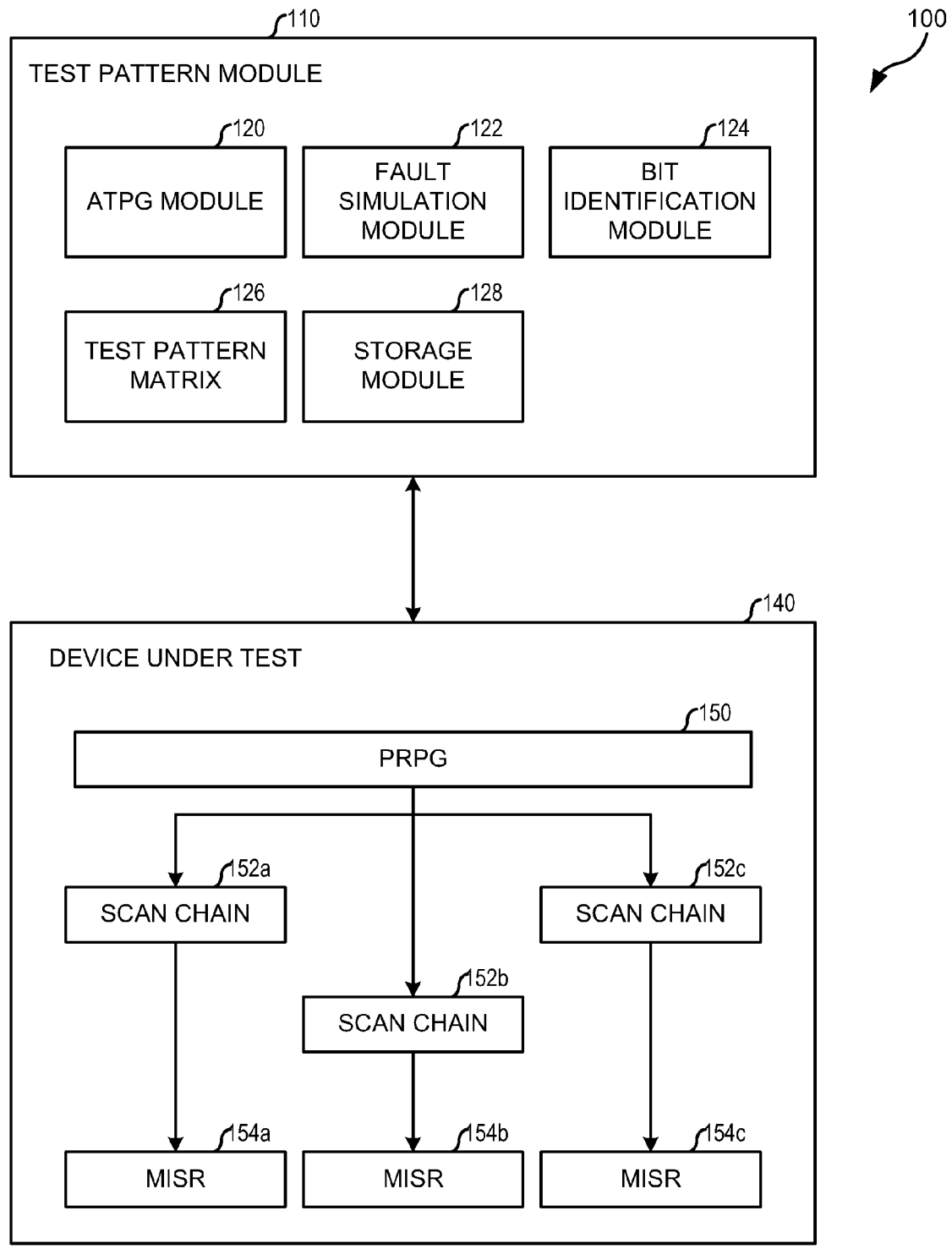
FIG. 1A illustrates a block diagram showing a test pattern module embodying the described method.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of a system 100 for improved test pattern compression. In accordance with a preferred embodiment of the present invention, system 100 comprises test module 110.

In the illustrated embodiment, test module 110 is an otherwise conventional test module modified as described below. Generally, test module 110 analyzes device under test (DUT) 140 and determines whether the DUT 140 operates as designed. In addition to conventional modules, test module 110 also comprises automatic test pattern generator (ATPG) module 120, fault simulation module 122, bit identification module 124, test pattern matrix 126, and storage module 128.

In the illustrated embodiment, ATPG module 120 is an otherwise conventional ATPG module modified as described below. Generally, ATPG module 120 generates test patterns used by test module 110 to test DUT 140. Fault simulation module 122 is an otherwise conventional fault simulation module modified as described below. Generally, fault simulation module 122 simulates application of a particular pattern to a known DUT 140 and determines the fault coverage provided by any particular test pattern, hereinafter sometimes referred to as "fault simulating".

In the illustrated embodiment, bit identification module 124 is an otherwise conventional bit identification module modified as described below. Generally, bit identification module 124 identifies particular bits within any particular test pattern used for testing DUT 140. Test pattern matrix 126 is an otherwise conventional test pattern matrix modified as described below. Generally, test pattern matrix 126 comprises a plurality of slots along a vertical axis configured to store test patterns, with the bits that make up each test pattern stored along a horizontal axis.

In the illustrated embodiment, testing module 110 places the test patterns within test pattern matrix 126 such that bits in varying test patterns stored in the same latch when the test pattern shifts into DUT 140 occupy the same column of the matrix. Storage module 128 is an otherwise conventional storage module modified as described below. Generally, storage module 128 stores information for the operation of testing module 128 and test pattern compression processes.

In the illustrated embodiment, DUT 140 is an otherwise conventional device or circuit to be tested. In the illustrated embodiment, DUT 140 comprises a pseudo-random pattern generator (PRPG) 150 (a decompressor) coupled to a plurality of scan chains represented by scan chains 152a, 152b, and 152c. A plurality of multiple-input shift registers (MISRs) (compactors), represented by MISR 154a, 154b, and 154c, couple to the scan chains.

One skilled in the art will understand that deterministic patterns created by ATPG module 120 are highly compressible. Typically, a user must specify only 1 to 5% of the scan chain latches to the ATPG tools in order to target a particular fault in a DUT. The specified bits for these scan chain latches constitute the "care bits" of the test pattern. The remaining bits of the test pattern are typically "don't-care" bits that can take on any logic value. Further, test patterns tend to be highly correlated, and a high correlation indicates a structural relation between the faults in the DUT.

Generally, prior art compression schemes require a hardware decompressor and a lossless compression method (code-based, linear-decompression-based, or broadcast-based) to compress test patterns before loading them onto the tester. The tester transfers the compressed patterns to the DUT via input pins. An on-chip decompressor decompresses the compressed test patterns at scan speed. The tester clocks in the test patterns and applies the patterns to the DUT, which provides responses based on the DUT's functional state. A compactor compacts the test pattern responses and shifts them to the tester via the output pins. The requirement of a hardware decompressor increases the cost of production for the DUT, increases the difficulty of testing late stage designs, and increases the difficulty of late stage modifications to the compression algorithm.

The pattern compression described herein exploits the high compressibility of deterministic test patterns. Additionally, pattern compression accomplished by pattern-merging easily integrates into typical software test generation tools. Most notably, the novel compression schemes described herein accomplish compression without the need for additional hardware. Eliminating the need for additional hardware saves chip area and allows implementation of the compression scheme on late stage designs for which hardware changes are not feasible. This type of compression also facilitates modifications to the compression algorithm without additional hardware changes.

As described in more detail below, in order to accomplish pattern-merging, ATPG module 120 creates fault-targeted test patterns based on information from the circuit model describing the DUT. ATPG module 120 randomly fills the don't-care bits of the test pattern with binary values so that the pattern is fully specified and more likely to detect additional faults. Fault simulation module 122 uses these fully-specified test patterns and information for the fault and circuit models to perform a fault simulation.

As described in more detail below, the fault simulation process determines which faults from the fault model the given pattern detects. The fault simulation process discards patterns that do not detect faults. Fault simulation also provides information regarding the fault coverage of the test. That is, when the generated test patterns together achieve the desired fault coverage, test pattern generation is complete. In the event that test pattern generation does not achieve the desired fault coverage, the entire pattern generation process repeats.

In either case, the pattern-merging compresses successful test patterns. As described in more detail below, the pattern-merging process assigns the bit values of the randomly filled don't-care bits that detect faults in fault simulation to the test pattern. The pattern-merging process also assigns an undefined value X to bits that do not participate in fault detection. In order to achieve compression, the pattern-merging process combines the resulting output pattern with other output. Generally, for two test patterns, Pattern A and Pattern B match if, for every care bit in Pattern A, Pattern B has a care bit of the same value or a don't-care bit. For example, the pattern 0X1X would match 01X1, but would not match 1XXX. In one embodiment, 0X1X and 01X1 combine into the merged pattern 0111.

In an illustrative exemplary embodiment of the invention, ATPG module 120 generates a first test pattern, in accordance with an otherwise conventional ATPG testing process. Bit identification module 124 identifies the don't-care bits of the first test pattern, and ATPG module 120 (or bit identification module 124) randomly fills the don't-care bits with either a logic high or logic low bit value to create a second test pattern. Storage module 128 stores the location and value of the don't-care bits in the second test pattern.

In the illustrative exemplary embodiment, fault simulation module 122 fault simulates the second test pattern and determines the fault coverage of the second test pattern. Fault simulation module 122 compares the fault coverage level of the second test pattern against a predetermined test pattern fault coverage level. In the event the second test pattern fails to meet or exceed the predetermined test pattern fault coverage level, fault simulation module 122 marks the second test pattern as ineffective. Test pattern module 110 discards ineffective test patterns.

In the illustrative exemplary embodiment, in the event that the second test pattern was ineffective, bit identification module 124 retrieves the location and logic value of the don't-care bits from storage module 128. Bit identification module 124 replaces the don't-care bits in the first test pattern with logic values that were not used in the generation of the second test pattern to create a third test pattern. Fault simulation module 122 fault simulates the third test pattern to determine the fault coverage of the third test pattern.

In the illustrative exemplary embodiment, fault simulation module 122 compares the fault coverage level of the third test pattern against a predetermined test pattern fault coverage level. In the event the third test pattern fails to meet or exceed the predetermined test pattern fault coverage level, fault simulation module 122 marks the third test pattern as ineffective. Test pattern module 110 discards the third test pattern. In the event that the second test pattern and third test pattern fail to meet the predetermined test pattern fault coverage level, test pattern module 110 discards the first test pattern and ATPG module 120 generates a fourth test pattern.

In the illustrative exemplary embodiment, in the event the second test pattern meets or exceeds the predetermined test pattern fault coverage level, bit identification module 124 identifies those bit positions corresponding to don't-care bits in the first test pattern that detected a fault during fault simulation, hereinafter sometimes referred to as "participatory bits." Bit identification module 124 assigns the participatory bits the bit value that detected a fault, effectively fixing the randomly assigned bit value as a care bit value.

Bit identification module 124 also identifies those bit positions corresponding to don't-care bits in the first test pattern that did not detect a fault during fault simulation, hereinafter sometimes referred to as "non-participatory bits." Bit identification module 124 assigns non-participatory bits a don't-care value and combines the participatory bits and non-participatory bits to create a fifth test pattern. Test pattern module 110 stores the fifth test pattern in a slot of test pattern matrix 126.

In the illustrative exemplary embodiment, after storing the fifth test pattern, fault simulation module 122 determines the total fault coverage level, which is the aggregate fault coverage of all the generated test patterns stored in test pattern matrix 126. Test module 110 stores the total fault coverage level in storage module 128. Fault simulation module 122 determines whether the total fault coverage level meets or exceeds a predetermined total fault coverage level. In the event that the total fault coverage level fails to meet or exceed the predetermined total fault coverage level, ATPG module 120 generates a new test pattern, repeating the above-described process.

In the illustrative exemplary embodiment, in the event that the total fault coverage level meets or exceeds the predetermined total fault coverage level, test pattern module 110 attempts to merge the test patterns. That is, having generated acceptable test patterns, test pattern module 110 performs a variety of novel operational steps to merge the resultant test patterns into a "compressed test pattern" according to the principles described herein. Referring now to FIG. 1B, block 190 represents the process described above to generate the test patterns. Next, as shown in block 192, test pattern module 110 performs "pattern merging," described below.

Generally, merging the test patterns begins with identifying the participating bits in comparable bit positions. In one embodiment, bit identification module 124 identifies all participating bits in a particular column of test pattern matrix 126. In the event that all of the identified participating bits have the same logic value, bit identification module 124 assigns the bit value to the equivalent bit position in a compressed test pattern.

In the illustrative exemplary embodiment, in the event that all bit values participating in fault detection within the column are not the same logic value, bit identification module 124 determines which participating bit logic value occurs most frequently within the particular column under investigation. In one embodiment, bit identification module 124 assigns the more frequently occurring bit value to the corresponding position within the compressed test pattern. Bit identification module 124 also stores the less frequently occurring bit value and bit positional information in storage module 128.

In some cases, neither the high bit value nor the low bit value occurs more frequently (or significantly more frequently) in participating bits. That is, in some cases the high and low bit values both occur exactly the same number of times. In other cases, the difference in frequency between the high and low bit values falls below a predetermined threshold of significance. In such cases, in one embodiment, bit identification module 124 assigns a random bit value to the corresponding position within the compressed test pattern. Bit identification module 124 also stores the opposite bit value for the bit position into the corresponding bit position in storage module 128.

Having formed a compressed test pattern, fault simulation module 122 fault simulates the compressed test pattern and stores the fault coverage value of the compressed test pattern in storage module 128. Referring now to FIG. 1B, block 192 represents the process described above to merge the test patterns. Next, as shown in block 194, test pattern module 110 performs a "weighted ATPG" process, described below.

In the illustrative exemplary embodiment, ATPG module 120 generates a template test pattern. Bit identification module 124 identifies the bit positions in the template test pattern corresponding to the bit positional information stored in storage module 128, which, as described above, comprises the non-selected bit values. Bit identification module 124 assigns the stored bit logic values to the corresponding positions of the template test pattern and ATPG module 120 (or bit identification module 124) randomly fills the remaining bits in the template test pattern to create a "weighted test pattern."

Test pattern module 110 uses the weighted test pattern as a base pattern for a pattern generation process substantially as described above. ATPG module 120 generates a plurality of test patterns based on the weighted test pattern, and fault simulation module 122 fault simulates the test patterns so formed. In one embodiment, test pattern module 110 merges the weighted test patterns with the compressed test pattern wherever possible. Fault simulation module 122 fault simulates the weighted test patterns to determine fault coverage. Test module 110 stores the weighted test patterns and associated fault coverage information in storage module 128.

In the illustrative exemplary embodiment, fault simulation module 122 determines the compressed fault coverage level, which is the combined fault coverage level of the compressed test pattern and the weighted test pattern. Test module 110 stores the compressed fault coverage level in storage module 128. Fault simulation module 112 compares the compressed fault coverage level to the total fault coverage level determined above. In the event that the compressed fault coverage level fails to meet or exceed the total test pattern coverage level, ATPG module 120 generates additional weighted test patterns until either achieving the desired fault coverage or reached a pre-determined time-out limit.

In the illustrative exemplary embodiment, in the event that test pattern module achieves the desired fault coverage or time-out has been reached, the process ends. At the end of the process, test pattern module 110 applies the compressed test pattern to the DUT for fault testing. System 100 of FIG. 1, generally illustrates the type of devices involved in the test pattern compression method.

Figure 2:
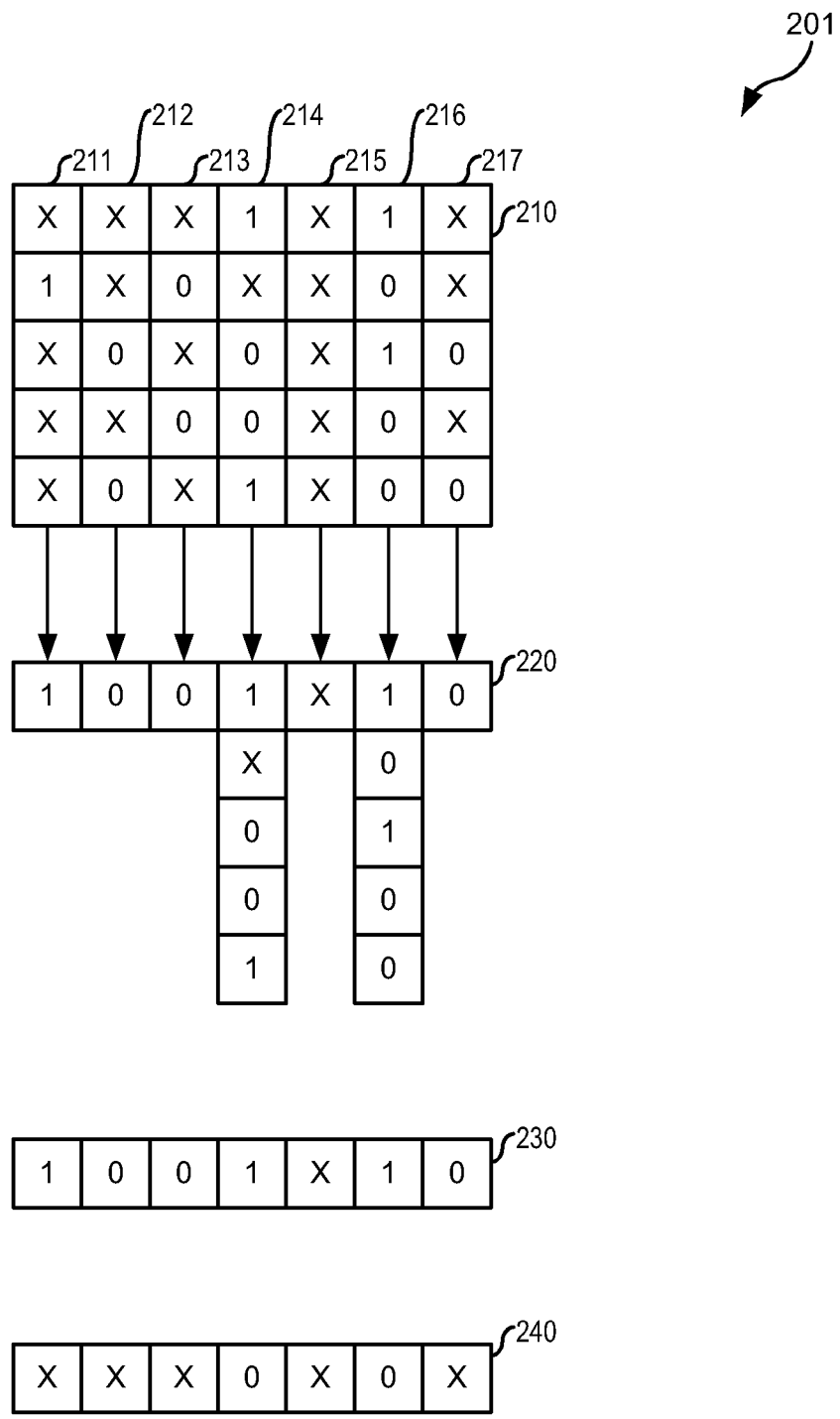
FIG. 2 illustrates a block diagram showing a graphical depiction of the test pattern compression method in operation.

FIG. 2 describes the test pattern merging process occurring within test pattern matrix 114 in additional detail. Specifically, FIG. 2 embodies system 200, comprising a plurality of graphical illustrations of the test patterns stored within test pattern matrix 126, in various stages during the operational steps of test pattern merging.

System 200 includes test pattern matrix 210, configured with five exemplary test patterns, with bit positions 211-217. A high bit value or a low bit value occupies each bit position where that bit participates in fault detection for that test pattern (a "participating bit"). In the event that the bit does not participate in fault detection for that test pattern (a "non-participating bit"), a don't-care value occupies the bit position, here represented by X.

As illustrated, in one embodiment, test pattern module 110 merges the test patterns into a merged pattern 220. For example, bit position 211 contains a single logic high value ("1") with a plurality of don't care values. As such, bit position 211 of merged pattern 220 is also a logic "1". Similarly, bit positions 212, 213, and 217 each contains two logic low values ("0") with a plurality of don't care values. As such, bit positions 212, 213, and 217 of merged pattern 220 are set to logic "0". Bit position 215 contains only don't care values, and as such, bit position 215 of merged pattern 220 is also a don't care value.

Bit position 214 includes an identical number of "1"s and "0"s, and as such, test pattern module 110 sets bit position 214 of merged pattern 220 to a random value, here a "1". Similarly, bit position 216 includes three "0"s and two "1"s. In an embodiment with a threshold inequality of two occurrences, the disparity between "1"s and "0"s in bit position 216 is not significant. As such, in one embodiment, test pattern module 110 sets bit position 214 of merged pattern 220 to a random value, here a "1".

The merged pattern 220 is also reflected in compressed test pattern 230. Generally, compressed test pattern 230 is the result of repeated pattern merging with multiple merged patterns 220. For the given compressed test pattern 230, weighted test pattern 240 represents an exemplary weighted test pattern in accordance with one embodiment of the present invention. Specifically, weighted test pattern 240 includes the opposite value (here, a "0") in contested bit positions 214 and 216. The remaining bit positions of weighted test pattern 240 are set to a don't care value.

Thus, generally, system 200 illustrates certain aspects of the pattern merger and weighted ATPG processes described above. The processes described in FIGS. 3-5 describe the operational steps in additional detail, in one embodiment. Generally, FIG. 3 primarily illustrates the initial pattern generation phase, FIG. 4 primarily illustrates the pattern merging phase, and FIG. 5 primarily illustrates the weighted ATPG phase, all described above.

Figure 1B:
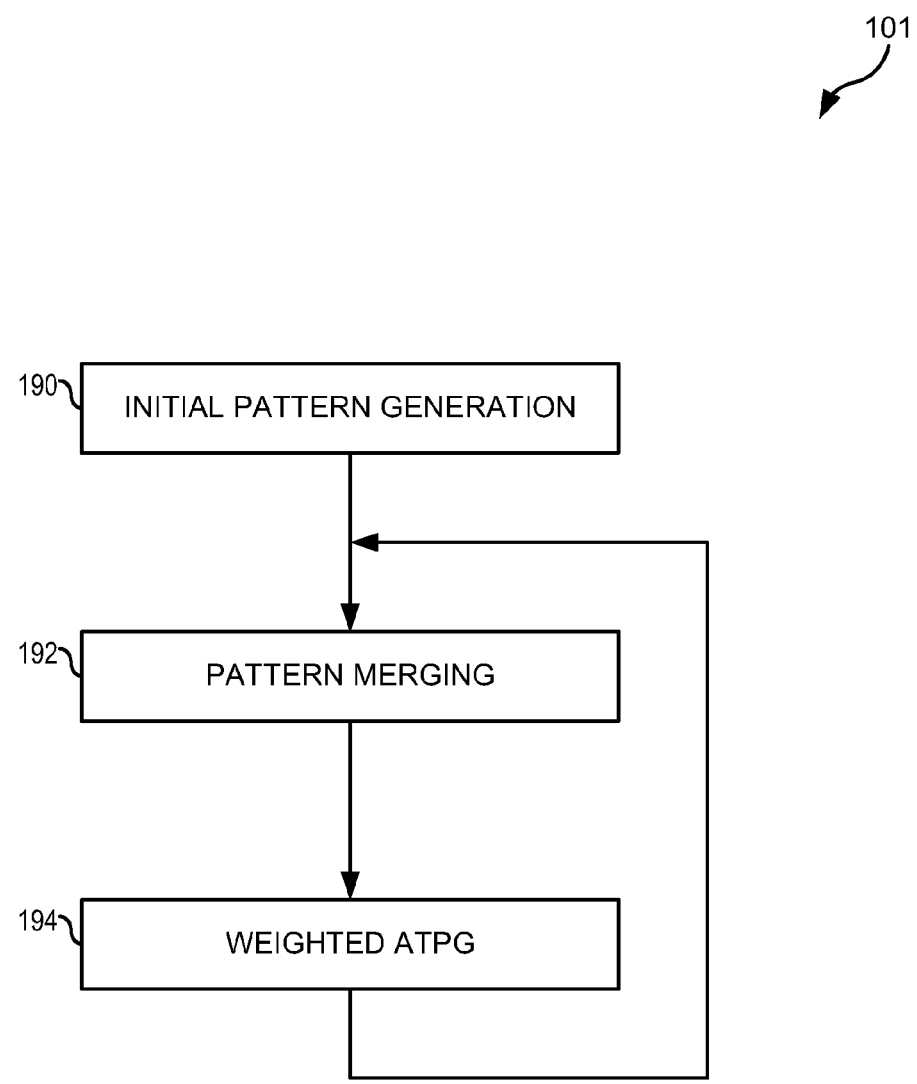
FIG. 1B illustrates a high-level flow diagram depicting logical operational steps of an improved test pattern compression method, which can be implemented in accordance with a preferred embodiment.
Figure 3:
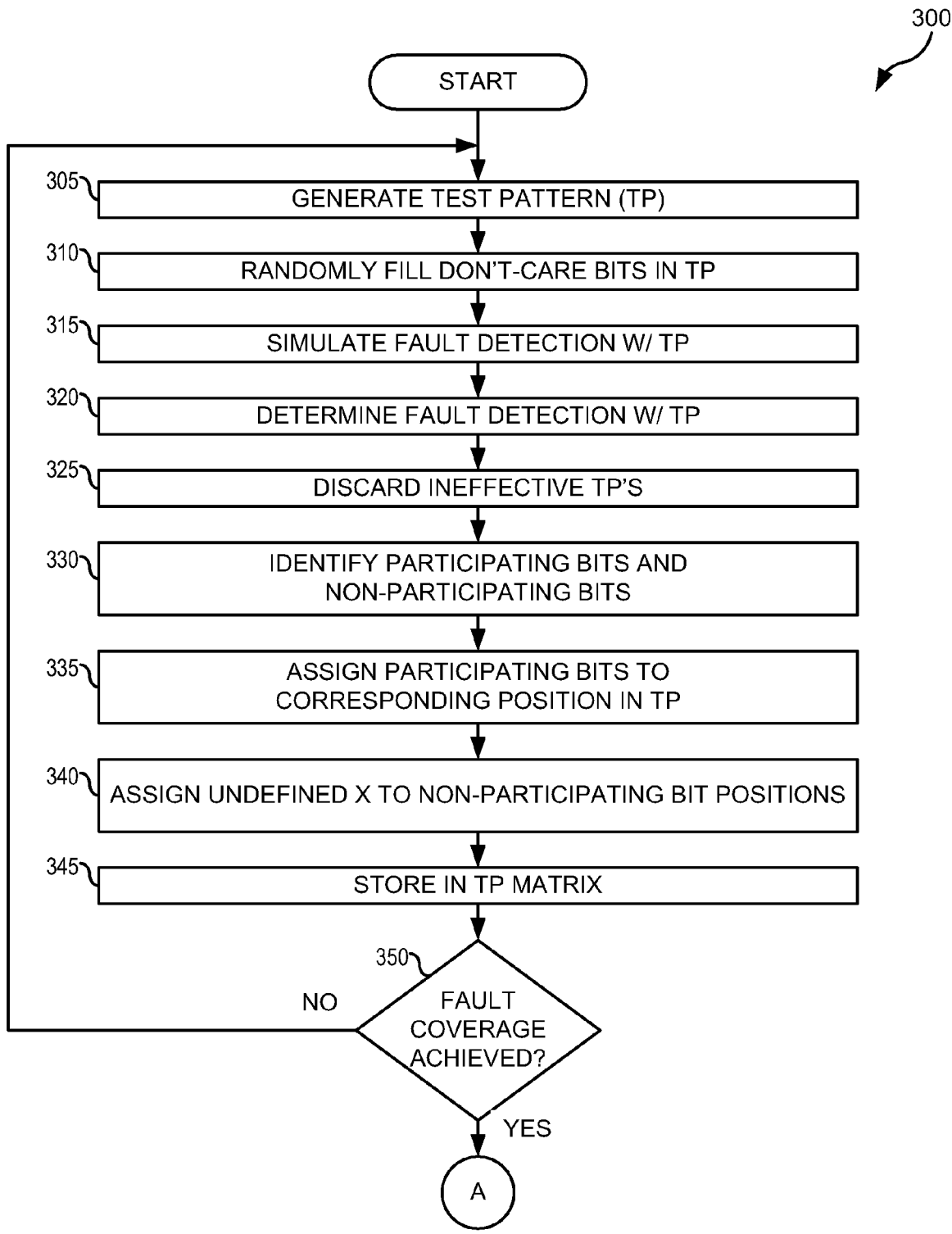
FIG. 3 illustrates a high-level flow diagram depicting logical operational steps of an improved test pattern compression method, which can be implemented in accordance with a preferred embodiment.
Figure 4:
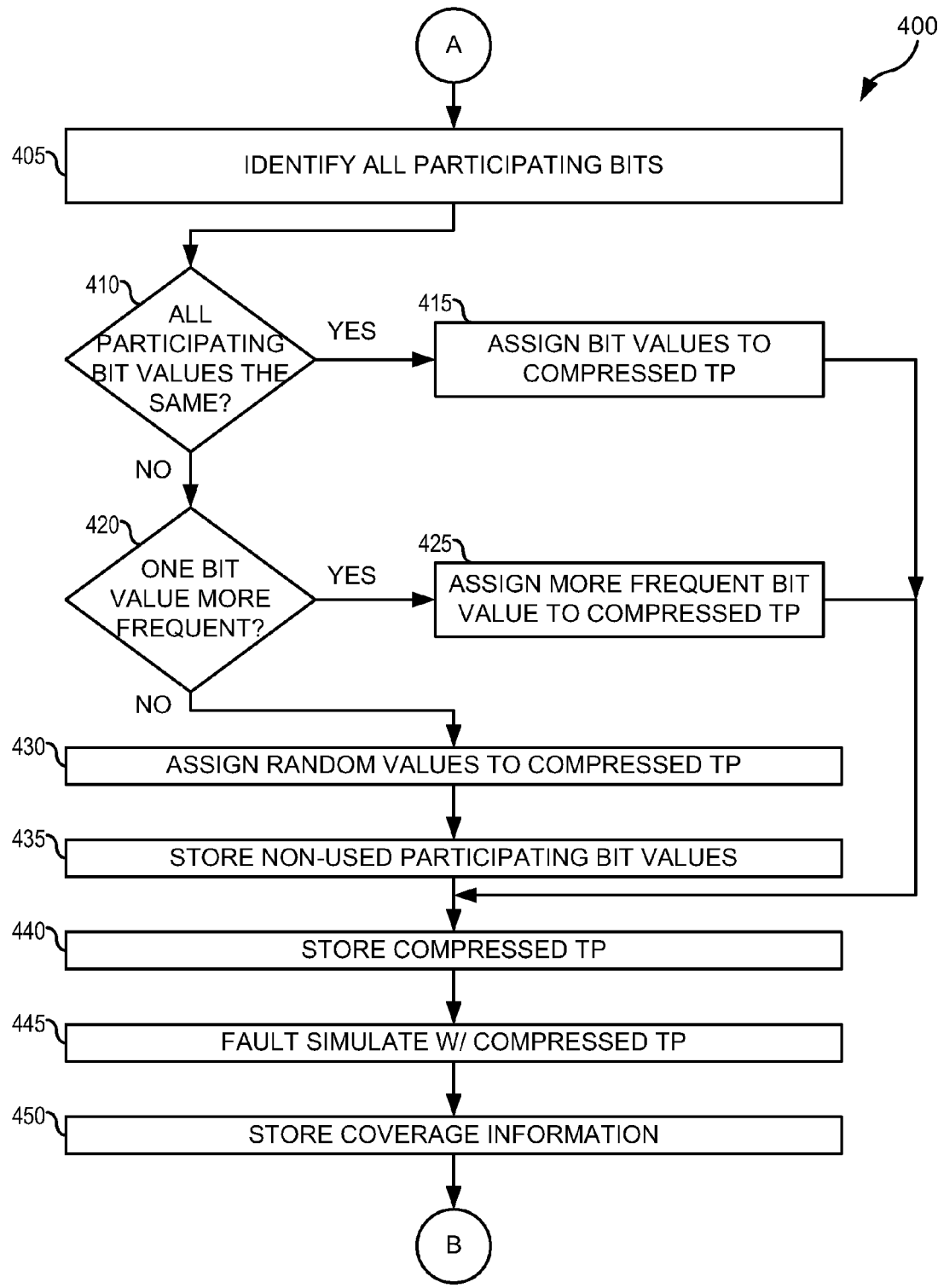
FIG. 4 illustrates a high-level flow diagram depicting logical operational steps of an improved test pattern compression method, which can be implemented in accordance with a preferred embodiment.

Specifically, FIG. 3, FIG. 4, and FIG. 5 illustrate high-level flow charts 300, 400, and 500 respectively, depicting logical operational steps performed by, for example, system 100 of FIG. 1A, which may be implemented in accordance with a preferred embodiment. As indicated at block 305, the process begins and system 100 generates a test pattern ("TP"). For example, ATPG module 120 generates a first test pattern.

Next, as indicated at block 310, system 100 randomly fills the don't-care bits in the first test pattern to create a second test pattern. For example, bit identification module 124 randomly fills the don't-care bits in the first test pattern to create a second test pattern. Next, as indicated at block 315, system 100 fault simulates the second test pattern. For example, fault simulation module 122 fault simulates the second test pattern. Next, as indicated at block 320, system 100 determines the fault detection coverage of the second test pattern. For example, fault simulation module 122 determines the fault coverage of the second test pattern.

Next, as indicated at block 325, system 100 discards ineffective test patterns. For example, fault simulation module 122 compares the fault coverage level of the second test pattern to a predetermined fault coverage level. In the event that the second test pattern does not meet or exceed the predetermined fault coverage level, test module 110 discards the second test pattern as ineffective. Next, as indicated at block 330, system 100 identifies the randomly filled don't-care bits that detected a fault (the "participating bits") and the randomly filled don't-care bits that did not detect a fault (the "non-participating bits"). For example, bit identification module 124 identifies the participating bits and the non-participating bits in the second test pattern.

Next, as indicated at block 335, system 100 assigns the logic values of the participating bits to the corresponding bit position in the second test pattern. For example, bit identification module 124 assigns the logic values of the participating bits to the corresponding bit position in the second test pattern. Next, as indicated at block 340, system 100 assigns an undefined X value to the non-participating bits. For example, bit identification module 124 assigns an undefined X value to the corresponding non-participating bit positions in the second test pattern.

Next, as indicated at block 345, system 100 stores the test pattern in a test pattern matrix. For example, bit identification module 124 stores the second test pattern in test pattern matrix 126. Next, as indicated at block 350, system 100 determines whether the fault coverage provided by the aggregate of all generated test patterns stored in the test pattern matrix achieves a predetermined total fault coverage level for the DUT. For example, fault simulation module 122 determines whether the fault coverage provided by the aggregate of all generated test patterns in test pattern matrix 126 achieves a predetermined total fault coverage level for DUT 140.

Next, as indicated at decisional block 355, in the event that fault coverage provided by the aggregate of all generated test patterns does not achieve a predetermined total fault coverage level for the DUT, system 100 continues along the NO branch, returning to block 305, wherein system 100 generates a new test pattern. In the event that, as indicated at decisional block 355, fault coverage provided by the aggregate of all generated test patterns achieves a predetermined total fault coverage level for the DUT, system 100 continues along the YES branch to Marker "A" of FIG. 4.

Referring now to FIG. 4, the process continues from Marker "A" to block 405. Next, as indicated at block 405, system 100 identifies all participating bits in each column of the test pattern matrix. For example, in one embodiment, bit identification module 124 identifies the bits in each column of test pattern matrix 126 that participate in fault detection.

Next, as indicated at block 410, system 100 determines whether the participating bits in a particular column of the test pattern matrix all have the same value. For example, bit identification module 124 determines whether all participating bits in a column of test pattern matrix 126 have the same value. In the event all participating bits in a column have the same value, the process continues along the YES branch to block 415. Next, as indicated at block 415, system 100 assigns the bit logic value that occurs in all participating bits in the column of the test pattern matrix to the corresponding bit position in a compressed test pattern. For example, bit identification module 124 assigns the logic value to the compressed test pattern. The process continues to block 440, described below.

In the event all participating bits in a column do not have the same value, the process continues along the NO branch to decisional block 420. Next, as indicated at decisional block 420, system 100 determines whether one bit value occurs more frequently than another in a column of the test pattern. In the event one bit value occurs more frequently than another in a column of the test pattern, the process continues along the YES branch to block 425. As indicated at block 425, system 100 assigns the more frequently occurring bit value of the column to the corresponding bit position in the compressed test pattern. For example, bit identification module 124 assigns the more frequently occurring bit value of the column to the corresponding bit position in the compressed test pattern. The process continues to block 440, described below.

In the event one bit value does not occur more frequently than another in a column of the test pattern, the process continues along the NO branch to block 430. As indicated at block 430, system 100 assigns a random bit value to the compressed test pattern. For example, bit identification module 124 determines that neither the logic high bit value, nor the logic low bit value occurs more frequently in the subject column of test pattern matrix 126. Bit identification module 124 assigns a random bit value to the corresponding bit position in the compressed test pattern.

Next, as indicated at block 435, system 100 stores the non-used bit values and corresponding bit positional information of participating bits. For example, bit identification module 124 stores the non-used bit values and corresponding bit positional information of participating bits in storage module 128. Next, as indicated at block 440, system 100 stores the compressed test pattern. For example, test module 110 stores the compressed test pattern in storage module 128.

Next, as indicated at block 455, system 100 fault simulates the compressed test pattern to determine fault coverage. For example, fault simulation module 122 fault simulates the compressed test pattern to determine fault coverage for the compressed test pattern. Next, as indicated block 450, system 100 stores the fault coverage information of the compressed test pattern. For example, system 100 stores the fault coverage information produced by fault simulation module 122 in storage module 128. The process continues to Marker "B" of FIG. 5.

Referring now to FIG. 5, the process continues from Marker "B" to block 505. Next, as indicated at block 505, system 100 generates a new test pattern. For example, ATPG module 120 generates a new test pattern. Next, as indicated at block 510, system 100 assigns the stored non-used bit values for the participating bits to the corresponding positions in the new test pattern, to create a weighted test pattern. For example, bit identification module 124 assigns the non-used bit values stored in storage module 128 to the new test pattern to create a weighted test pattern.

Next, as indicated at block 515, system 100 randomly fills the don't-care bits of the weighted test pattern. For example, bit identification module 124 randomly fills the don't-care bits of the weighted test pattern. Next, as indicated at block 520, system 100 fault simulates the weighted test pattern. For example, fault simulation module 122 fault simulates the weighted test pattern to determine fault coverage information for the weighted test pattern.

Next as indicated at decisional block 525, system 100 determines whether the total fault coverage provided by the compressed test pattern and the weighted test pattern is equal to or greater than the total fault coverage of the uncompressed patterns. In an alternate embodiment, system 100 determines whether the total fault coverage provided by the compressed test pattern and the weighted test pattern is equal to or greater than a predetermined fault coverage. For example, fault simulation module 122 determines whether the total fault coverage provided by the compressed test pattern and the weighted test pattern is equal to or greater than the total fault coverage of all test patterns in test pattern matrix 126.

In the event the total fault coverage provided by the compressed test pattern and the weighted test pattern is not equal to or greater than the total fault coverage of the uncompressed patterns, the process continues along the NO branch, returning to block 505, wherein system 100 generates a new test pattern. In the event the total fault coverage provided by the compressed test pattern and the weighted test pattern is equal to or greater than the total fault coverage of the uncompressed patterns, the process continues along the YES branch to decisional block 530.

Next, as indicated at decisional block 530, system 100 determines whether it is possible to further merge the weighted test pattern with the compressed test pattern. For example, bit identification module 124 determines whether it is possible to merge the compressed test pattern with the weighted test pattern. In the event it is possible to further merge the weighted test pattern with the compressed test pattern, the process continues along the YES branch to block 535. Next, as indicated at block 535, test pattern module 110 merges the weighted test pattern with the compressed test pattern and the process continues to decisional block 540.

In the event it is not possible to merge the weighted test pattern with the compressed test pattern, the process continues along the NO branch to decisional block 540. Next, as indicated at decisional block 540, system 100 determines whether a desired compaction has been achieved. For example, test module 110 determines whether the compressed test pattern and weighted test patterns together achieve a predetermined compaction level. In the event that a desired compaction has been achieved, the process continues along the YES branch, ending. In the event that a desired compaction has not been achieved, the process continues along the NO branch to decisional block 545.

Next, as indicated at decisional block 545, system 100 determines whether time-out has been reached. For example, test module 110 determines whether time-out has been reached. In the event time-out has been reached, the process continues along the YES branch, ending. In the event time-out has not been reached, the process continues along the NO branch, returning to Marker "A" of FIG. 4, described above.

Thus, generally, the processes outlined in FIGS. 3-5 achieve an improved test pattern compression. In particular, the novel methods described herein achieve a greater compression level than conventional methods. The increased compression level achieved by the described embodiments enhances on-chip testing, and generally serves to improve the ATPG and testing processes overall, especially as applied to dense modern circuits.

Accordingly, the disclosed embodiments provide numerous advantages over other methods and systems. For example, the disclosed embodiments reduce the set of test patterns necessary to achieve the desired fault coverage to a manageable level for modern dense circuits. Additionally, the disclosed embodiments require less storage space for the total set of test patterns than conventional methods for circuits of the same density. Further, the disclosed embodiments reduce the total time necessary to test a modern circuit to the desired fault coverage due to the decreased size of the total test pattern set.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations, or improvements therein may be subsequently made by those skilled in the art, which are also intended to be encompassed by the following claims.

What is claimed is:

1. A method for test pattern compression, comprising:
generating a first test pattern, by a hardware test pattern module, the first test pattern comprising a plurality of bits, multiple bits of the plurality of bits having an associated unique bit position and a bit value, wherein the bit value comprises one of a high value, a low value, and a don't-care value;
identifying, by a hardware bit identification module, bits comprising a don't-care bit value in the first test pattern;
replacing, by a test pattern module, the identified bit values in the first test pattern with random bit values, comprising either the high value or the low value, to generate a second test pattern; determining a fault coverage level of the second test pattern;
in the event the determined fault coverage level of the second test pattern exceeds a predetermined individual test pattern fault coverage level, determining, by a fault simulation module, whether one or more of the bit positions in the second test pattern corresponding to the replaced identified bit values detected at least one fault;
and for at least one bit position in the second test pattern corresponding to a replaced identified bit value and detecting at least one fault, exchanging, by the test pattern module, the don't care value in the bit position in the first test pattern with the bit value in the corresponding bit position in the second test pattern.

2. The method of claim 1, wherein determining the fault coverage level of the second test pattern comprises:
simulating application of the second test pattern to a predetermined electronic circuit comprising known faults;
determining whether one or more bit positions in the second test pattern detect one or more of the known faults in the predetermined electronic circuit; and
in the event one or more bit positions detect one or more of the known faults, identifying which of the bit positions in the second test pattern detect one or more of the known faults.

3. The method of claim 1, further comprising:
for at least one bit position in the second test pattern corresponding to a replaced identified bit value and not detecting at least one fault, assigning a don't care bit value to the bit position in the first test pattern to generate a modified first test pattern, and storing the modified first test pattern in a slot of a test pattern matrix;
determining whether the combined fault coverage of the plurality of test patterns in the test pattern matrix achieves a desired total fault coverage; and
in the event the combined fault coverage does not achieve the desired total fault coverage, generating a new test pattern.

4. The method of claim 3, further comprising, in the event the combined fault coverage achieves the desired total fault coverage:
determining whether the high bit value or the low bit value of the bits occupying the same position within the test pattern matrix occurs more frequently;
in the event that the high bit value or the low bit value of the bits occupying the same position within the test pattern matrix occurs more frequently, assigning the more frequently occurring bit value to the corresponding bit position in a compressed test pattern;
in the event that neither the high bit value or the low bit value of the bits occupying the same position with the test pattern matrix occurs more frequently, randomly assigning either a high bit value or a low bit value to the corresponding bit position in the compressed test pattern;

in the event that the high bit value is assigned to the corresponding bit position in the compressed test pattern, storing the low bit value in the corresponding bit position in a third test pattern;

in the event that the low bit value is assigned to the corresponding bit position in the compressed test pattern, storing the high bit value in the corresponding bit position in the third test pattern;

determining a fault coverage level of the compressed test pattern; and storing fault coverage information of the compressed test pattern.

5. The method of claim 4, further comprising:

identifying the don't-care bit positions of the third test pattern;

randomly filling the don't-care bit positions of the third test pattern;

determining a fault coverage level of the third test pattern;

determining the cumulative value of the fault coverage levels of the compressed test pattern and the third test pattern, wherein the cumulative value of the fault coverage levels of the compressed test pattern and the third test pattern comprise a second cumulative fault coverage value; and in the event the second cumulative fault coverage value is equivalent to or exceeds the first cumulative fault coverage value, merging the third test pattern with the compressed test pattern.

6. The method of claim 5, further comprising:

determining whether a desired compaction has been reached;

in the event that a desired compaction has not been reached, determining whether a time-out has been reached, and in the event that time-out has been not been reached, generating a new test pattern.

7. A non-transitory computer usable medium containing computer usable program code therein for causing a computer processor to perform test pattern compression, comprising:

computer usable program code configured to generate a first test pattern, the first test pattern comprising a plurality of bits, multiple bits of the plurality of bits having an associated unique bit position and a bit value, wherein the bit value comprises one of a high value, a low value, and a don't-care value;

computer usable program code configured to identify bits comprising a don't-care bit value in the first test pattern;

computer usable program code configured to replace the identified bit values in the first test pattern with random bit values comprising either the high value or the low value, to generate a second test pattern;

computer usable program code configured to determine a fault coverage level of the second test pattern;

computer usable program code configured to, in the event the determined fault coverage level of the second test pattern exceeds a predetermined individual test pattern fault coverage level, determine whether one or more of the bit positions in the second test pattern corresponding to the replaced identified bit values detected at least one fault; and computer usable program code configured to, for at least one bit position in the second test pattern corresponding to a replaced identified bit value and detecting at least one fault, exchange the don't care value in the bit position in the first test pattern with the bit value in the corresponding bit position in the second test pattern.

8. A non-transitory computer usable medium of claim 7, wherein computer usable program code configured to determine the fault coverage level of the second test pattern comprises:

computer usable program code configured to simulate application of the second test pattern to a predetermined electronic circuit comprising known faults;

computer usable program code configured to determine whether one or more bit positions in the second test pattern detect one or more of the known faults in the predetermined electronic circuit; and computer usable program code configured to, in the event one or more bit positions detect one or more of the known faults, identify which of the bit positions in the second test pattern detect one or more of the known faults.

9. The non-transitory computer usable medium of claim 7, further comprising:

computer usable program code configured to, for at least one bit position in the second test pattern corresponding to a replaced identified bit value and not detecting at least one fault, assign a don't care bit value to the bit position in the first test pattern to generate a modified first test pattern, and store the modified first test pattern in a slot of a test pattern matrix;

computer usable program code configured to determine whether the combined fault coverage of the plurality of test patterns in the test pattern matrix achieves a desired total fault coverage; and computer usable program code configured to, in the event the combined fault coverage does not achieve the desired total fault coverage, generate a new test pattern.

10. The non-transitory computer usable medium of claim 9, further comprising computer usable program code configured to, in the event the combined fault coverage achieves the desired total fault coverage:

determine whether the high bit value or the low bit value of the bits occupying the same position within the test pattern matrix occurs more frequently;

in the event that the high bit value or the low bit value of the bits occupying the same position within the test pattern matrix occurs more frequently, assign the more frequently occurring bit value to the corresponding bit position in a compressed test pattern;

in the event that neither the high bit value or the low bit value of the bits occupying the same position with the test pattern matrix occurs more frequently, randomly assign either a high bit value or a low bit value to the corresponding bit position in the compressed test pattern;

in the event that the high bit value is assigned to the corresponding bit position in the compressed test pattern, store the low bit value in the corresponding bit position in a third test pattern;

in the event that the low bit value is assigned to the corresponding bit position in the compressed test pattern, store the high bit value in the corresponding bit position in the third test pattern;

determine a fault coverage level of the compressed test pattern; and store fault coverage information of the compressed test pattern.

11. The non-transitory computer usable medium of claim 10, computer usable program code further configured to:
- identify the don't-care bit positions of the third test pattern;
- randomly fill the don't-care bit positions of the third test pattern;
- determine a fault coverage level of the third test pattern;
- determine the cumulative value of the fault coverage levels of the compressed test pattern and the third test pattern, wherein the cumulative value of the fault coverage levels of the compressed test pattern and the third test pattern comprise a second cumulative fault coverage value; and
- in the event the second cumulative fault coverage value is equivalent to or exceeds the first cumulative fault coverage value, merge the third test pattern with the compressed test pattern.

12. The non-transitory computer usable medium of claim 11, the computer usable program code further configured to:
- determine whether a desired compaction has been reached;
- in the event that a desired compaction has not been reached, determine whether a time-out has been reached, and in the event that time-out has been not been reached, generate a new test pattern.

13. A system, comprising:
- a hardware test pattern module configured to generate a first test pattern, the first test pattern comprising a plurality of bits, multiple bits of the plurality of bits having an associated unique bit position and a bit value, wherein the bit value comprises one of a high value, a low value, and a don't-care value;
- the test pattern module comprising a bit identification module coupled to the test pattern module and configured to identify bits comprising a don't-care bit value in the first test pattern;
- the test pattern module configured to replace the identified bit values in the first test pattern with random bit values comprising either the high value or the low value, to generate a second test pattern;
- the test pattern module further comprising a fault simulation module configured to determine a fault coverage level of the second test pattern;
- the fault simulation module further configured to, in the event the determined fault coverage level of the second test pattern exceeds a predetermined individual test pattern fault coverage level, determine whether one or more of the bit positions in the second test pattern corresponding to the replaced identified bit values detected at least one fault; and
- the test pattern module further configured to, for at least one bit position in the second test pattern corresponding to a replaced identified bit value and detecting at least one fault, exchange the don't care value in the bit position in the first test pattern with the bit value in the corresponding bit position in the second test pattern.

14. The system of claim 13, wherein the fault simulation module is further configured to:
- simulate application of the second test pattern to a predetermined electronic circuit comprising known faults;
- determine whether one or more bit positions in the second test pattern detect one or more of the known faults in the predetermined electronic circuit; and
- in the event one or more bit positions detect one or more of the known faults, identify which of the bit positions in the second test pattern detect one or more of the known faults.

15. The system of claim 13, further comprising:
- the test pattern module further comprising a text pattern matrix;
- the test pattern module further configured to, for at least one bit position in the second test pattern corresponding to a replaced identified bit value and not detecting at least one fault, assign a don't care bit value to the bit position in the first test pattern to generate a modified first test pattern, and store the modified first test pattern in a slot of the test pattern matrix;
- the fault simulation module further configured to determine whether the combined fault coverage of the plurality of test patterns in the test pattern matrix achieves a desired total fault coverage; and
- the test pattern module further configured to, in the event the combined fault coverage does not achieve the desired total fault coverage, generate a new test pattern.

16. The system of claim 15, wherein the fault simulation module is further configured to:
- determine whether the high bit value or the low bit value of the bits occupying the same position within the test pattern matrix occurs more frequently;
- in the event that the high bit value or the low bit value of the bits occupying the same position within the test pattern matrix occurs more frequently, assign the more frequently occurring bit value to the corresponding bit position in a compressed test pattern;
- in the event that neither the high bit value or the low bit value of the bits occupying the same position with the test pattern matrix occurs more frequently, randomly assign either a high bit value or a low bit value to the corresponding bit position in the compressed test pattern;
- in the event that the high bit value is assigned to the corresponding bit position in the compressed test pattern, store the low bit value in the corresponding bit position in a third test pattern;
- in the event that the low bit value is assigned to the corresponding bit position in the compressed test pattern, store the high bit value in the corresponding bit position in the third test pattern;
- determine a fault coverage level of the compressed test pattern; and
- store fault coverage information of the compressed test pattern in a storage module.

17. The system of claim 16, wherein the fault simulation module is further configured to
- identify the don't-care bit positions of the third test pattern;
- randomly fill the don't-care bit positions of the third test pattern;
- determine a fault coverage level of the third test pattern;
- determine the cumulative value of the fault coverage levels of the compressed test pattern and the third test pattern, wherein the cumulative value of the fault coverage levels of the compressed test pattern and the third test pattern comprise a second cumulative fault coverage value; and
- in the event the second cumulative fault coverage value is equivalent to or exceeds the first cumulative fault coverage value, merge the third test pattern with the compressed test pattern.

18. The system of claim 17, wherein the test pattern module is further configured to:
- determine whether a desired compaction has been reached;
- in the event that a desired compaction has not been reached, determine whether a time-out has been reached, and
- in the event that time-out has been not been reached, generate a new test pattern.

* * * * *